(12) United States Patent
Lindsey et al.

(10) Patent No.: US 7,053,644 B1
(45) Date of Patent: May 30, 2006

(54) SYSTEM FOR TESTING AND BURNING IN OF INTEGRATED CIRCUITS

(75) Inventors: Scott E. Lindsey, Brentwood, CA (US); Carl N. Buck, Cupertino, CA (US); Rhea J. Posedel, Belmont, CA (US)

(73) Assignee: Aehr Test Systems, Fremont, CA (US)

( * ) Notice: Subject to any disclaimer, the term of this patent is extended or adjusted under 35 U.S.C. 154(b) by 0 days.

(21) Appl. No.: 11/013,855

(22) Filed: Dec. 15, 2004

(51) Int. Cl.
*G01R 31/02* (2006.01)

(52) U.S. Cl. .................. 324/761; 324/754; 324/158.1; 324/755

(58) Field of Classification Search ................ 324/765, 324/757, 758, 754, 761, 158.1, 72.5
See application file for complete search history.

(56) References Cited

U.S. PATENT DOCUMENTS 6,288,561 B1 * 9/2001 Leedy ..................... 324/760
6,819,132 B1 * 11/2004 Byrd ......................... 324/765

* cited by examiner

Primary Examiner—Jermele M. Hollington
Assistant Examiner—Jimmy Nguyen
(74) Attorney, Agent, or Firm—Blakely, Sokoloff, Taylor & Zafman; Stephen M. De Klerk

(57) ABSTRACT

A system for testing integrated circuits is described. A contactor board of the system has pins with ends that contact terminals on a power and signal distribution board. Opposing ends of the pins make contact with die terminals on an unsingulated wafer. The distribution board also carries a plurality of capacitors, at least one capacitor corresponding to every die on the unsingulated wafer. Each capacitor may include two substantially flat planar capacitor conductors and a dielectric layer between the capacitor conductors. Alternatively, the capacitors may be discrete components mounted to and standing above the distribution board, in which case corresponding capacitor openings are formed in the contactor substrate to accommodate the capacitors when the distribution board and the contactor board are brought together. A plurality of fuses made of a polymer material are also provided. The polymer material limits the flow of current flowing therethrough when the temperature of a fuse increases, and increases the current therethrough when the temperature of the fuse decreases.

26 Claims, 6 Drawing Sheets

SYSTEM FOR TESTING AND BURNING IN OF INTEGRATED CIRCUITS

BACKGROUND OF THE INVENTION

1). Field of the Invention

This invention relates to a system for testing and burning in of integrated circuits of an unsingulated wafer.

2). Discussion of Related Art

Integrated circuits, such as circuits with metal-oxide-semiconductor (MOS) transistors or laser diodes, are usually manufactured in and on wafer substrates. Such a wafer substrate is then "diced" or "singulated" into individual dies, each die having a respective integrated circuit. The die can then be mounted to a supporting substrate for purposes of providing rigidity to the die and for providing power, a ground reference voltage and signals to or from the integrated circuit in the die.

Integrated circuits are usually tested and burned in before being shipped to a customer. It is desirable to identify defective integrated circuits at an early stage for purposes of determining where defects typically occur and for reducing downstream manufacturing and packaging costs. Ideally, some testing is carried out before a wafer is singulated. Burn-in may be performed to induce devices with latent defects to fail, which otherwise would not occur until the integrated circuit had been in use for some time.

Relatively complex prober-based systems have traditionally been used for burn-in testing of integrated circuits at wafer level. Such a system typically has probe contacts and a relatively complex mechanism that can move a wafer in x-, y- and z directions so that die contacts on successive integrated circuits are brought into contact with the probe contacts. A test sequence is provided through the probe contacts to each integrated circuit while being exposed to a predetermined temperature profile.

Certain advances have been made in recent years to simultaneously contact die contacts of integrated circuits of an entire unsingulated wafer, often referred to as "full wafer probing," and then test the integrated circuits of the entire wafer. A system that is used for burn-in or testing integrated circuits of an array of dies of an unsingulated wafer usually has a distribution board for distributing power, a ground reference voltage, and signals in x- and y-directions to distribution board contacts that mirror the die contacts over an x-y area on the wafer substrate. A contactor board is located between the distribution board and the wafer, the contactor board having contactor pins that interconnect the distribution board contact terminals in a z-direction with the die contacts.

For performing burn-in, such a system together with the unsingulated wafer can then be inserted into a thermal management system such as an oven. An interface on the distribution board connects to a connector in the oven so that power, a ground reference voltage and signals can be provided through the connector, the distribution board and the contactor board to or from the integrated circuits. The integrated circuits undergo burn-in testing while the temperature of the wafer is controlled.

SUMMARY OF THE INVENTION

The invention generally relates to a system for testing integrated circuits of a plurality of dies of an unsingulated wafer, which generally includes a distribution board which includes a distribution substrate having a plurality of regions to mirror the dies of the unsingulated wafer, a plurality of distribution board terminals at each region, the distribution board terminals at each region including at least one signal, power and reference voltage distribution board terminal, a plurality of distribution board conductors carried by the distribution substrate, including signal, power and reference voltage distribution board conductors connected to the signal, power and reference voltage distribution board terminals, respectively, and at least one distribution board interface, on the distribution substrate, to which the distribution board conductors are connected.

According to one aspect of the invention, the system includes at least one capacitor, which includes spaced power and reference voltage capacitor conductors that are electrically connected to the power and reference voltage distribution board terminals, respectively, of at least one of the regions.

The capacitor may be carried by the distribution board.

The power and reference voltage capacitor conductors may be substantially flat planar conductors.

Each substantially flat planar conductor may have an area comprising a majority of an area of a respective region.

The distribution board terminals may be contacts, in which case each substantially flat planar capacitor conductor may have a portion formed on a respective contact, the capacitor further including a dielectric layer between the substantially flat planar capacitor conductors.

Each substantially flat planar conductor may be formed over at least some of the distribution board conductors.

The system may include a plurality of capacitors, each including spaced power and reference voltage capacitor conductors electrically connected to respective power and reference voltage distribution board terminals of a plurality of the respective regions.

The system may further include a contactor, which may include a contactor substrate having a first side facing the distribution substrate and a second opposing side, a first plurality of contactor terminals on the first side, each contacting a respective one of the distribution board terminals, and a second plurality of contactor terminals on the second side of the contactor substrate, each connected to a respective one of the first plurality of contactor terminals and each for contacting a respective die contact of a respective one of the dies.

One of the distribution substrate and the contactor substrate may be a first substrate and the other one of the distribution substrate and the contactor substrate may be a second substrate, the capacitor being mounted to the first substrate, at least one capacitor opening being formed in the second substrate and the capacitor being inserted into the capacitor opening.

Preferably, the distribution substrate is the first substrate.

The system may include a plurality of capacitors, each capacitor being mounted to the first substrate, and a plurality of capacitor openings may be formed in the second substrate, each capacitor being inserted in a respective one of the capacitor openings.

There may be no x-y transformation from the first plurality of contactor terminals to the second plurality of contactor terminals.

The contactor may further include a plurality of pins held by the contactor substrate, each pin having opposing ends that form the respective first and second contactor terminals.

The system may include at least one fuse that automatically limits current flowing to at least one of the dies. The fuse may be made of a polymer material that limits current flowing therethrough when a temperature thereof increases.

It is within the scope of this invention that the term "fuse" as used herein should be broadly interpreted and encompass components that are not referred to in the art as "fuses," i.e., electric disconnects such as sensor-based switches, etc.

The system may include a discrete electric component mounted to and standing above the distribution substrate, in which case an opening may be formed in a first side of the contactor substrate, the discrete electric component being inserted in the opening.

According to another aspect of the invention, a method is provided for testing integrated circuits of a plurality of dies of an unsingulated wafer, which includes contacting a plurality of die contacts of the dies of the unsingulated wafer with a plurality of contactor terminals, providing current through a subset of the contactor terminals to the dies, current to each one of the dies flowing through a respective fuse, which limits the current therethrough when a temperature of the fuse increases and at least partially restores current therethrough when the temperature of the fuse decreases.

BRIEF DESCRIPTION OF THE DRAWINGS

The invention is further described by way of examples with reference to the accompanying drawings wherein.

DETAILED DESCRIPTION OF THE INVENTION

Figure 1:
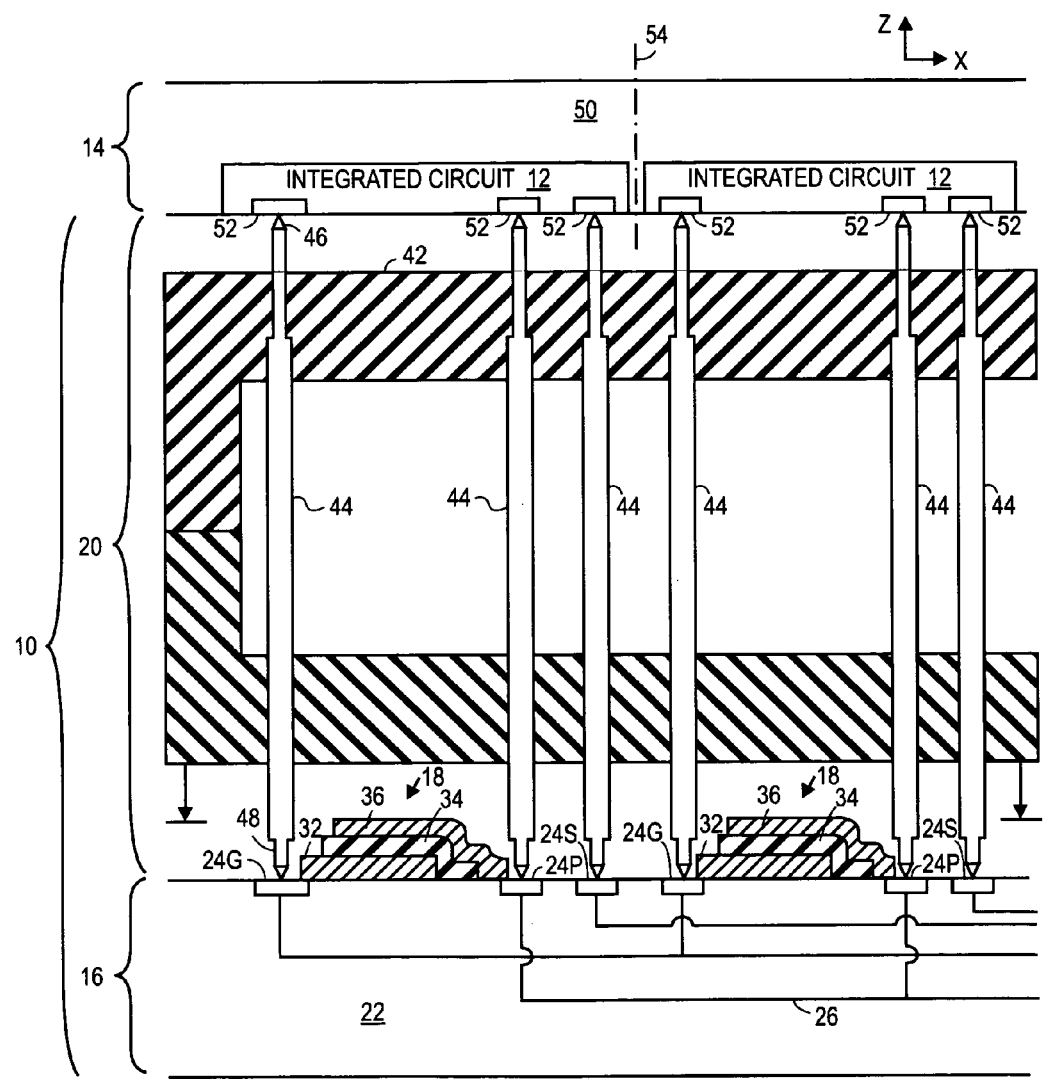
FIG. 1 is a cross-sectional side view of a portion of system, according to an embodiment of the invention, that is used for testing integrated circuits of a plurality of dies of an unsingulated wafer.

FIG. 1 of the accompanying drawings illustrates components of a contactor system 10, according to an embodiment of the invention, that is used for burn-in testing of integrated circuits 12 of an unsingulated wafer 14. The system 10 includes a power, ground reference voltage, and signal distribution board 16, a plurality of capacitors 18, and a contactor board 20. Other components such as embedded resistors, etc., that are beyond the scope of the invention are not illustrated or described herein.

Figure 2:
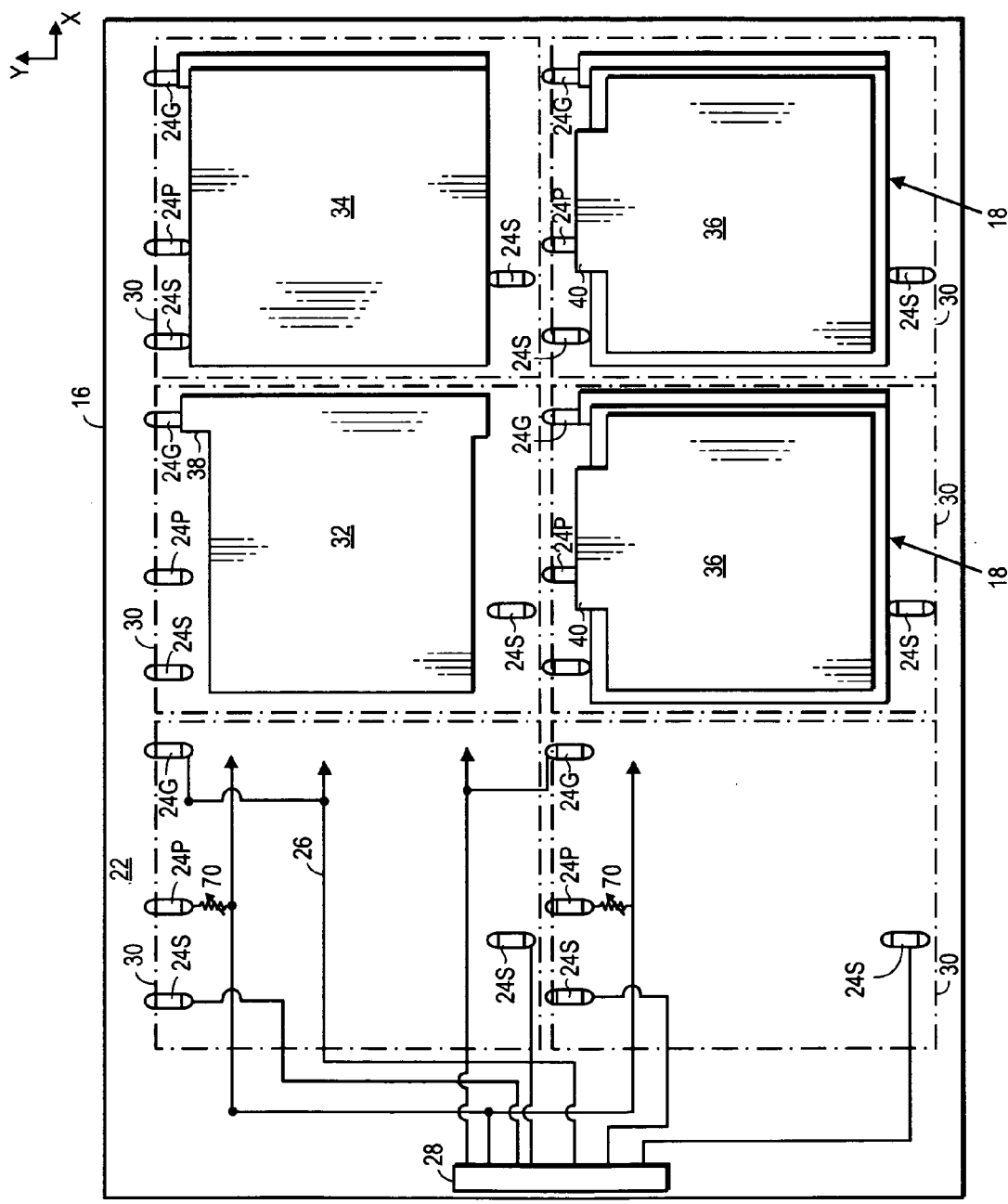
FIG. 2 is a top plan view of a power, ground reference voltage, and signal distribution board and capacitors forming part of the system, wherein some of the capacitors are shown at different stages of the manufacture of all the capacitors simultaneously.

Referring to FIG. 2, the distribution board 16 includes a distribution substrate 22, a plurality of distribution board contact terminals 24, a plurality of distribution board conductors 26, and a distribution board interface 28.

The distribution substrate 22 has a plurality of regions 30. The regions 30 are in rows extending in an x-direction and columns extending in a y-direction to form an x-y array, each region 30 mirroring a respective one of the integrated circuits 12 (FIG. 1). More than one capacitor may alternatively be associated with one integrated circuit, or one capacitor may be associated with more than one integrated circuit. The distribution substrate 22 includes multiple layers of low k-value (typically three to four) dielectric material, alternated by conductive metal layers.

The distribution board contact terminals 24 are formed out of an upper one of the conductive metal layers in the distribution substrate 22. Each region 30 has at least one power distribution board contact terminal 24P, at least one ground reference voltage distribution board contact terminal 24G, and a number of signal distribution board contact terminals 24S. The location of the power distribution board contact terminal 24P is identical from one of the regions 30 to the next, as are the locations of the ground reference voltage distribution board contact terminals 24G and the signal distribution board contact terminals 24S.

The distribution board conductors 26 are made out of metal lines that are defined in the conductive metal layers in the distribution substrate 22 and out of vias and plugs that interconnect the metal lines. Each one of the distribution board contact terminals 24 is connected to a respective one of the distribution board conductors 26. The distribution board conductors 26 thus include power, ground reference voltage, and signal distribution board conductors that are connected to the power, ground reference voltage, and signal distribution board contact terminals 24P, 24G, and 24S, respectively.

The distribution board interface 28 is a connector that is mounted to an edge of the distribution substrate 22. The distribution board conductors 26 are connected to the distribution board interface 28. As such, power, a ground reference voltage, and signals can be provided through the distribution board interface 28 and the distribution board conductors 26 to the distribution board contact terminals 24. Although only illustrated in two of the regions 30, it should be understood that the distribution board conductors 26 extend below a surface of the distribution substrate 22 across all of the regions 30.

Each capacitor 18 includes a ground reference voltage capacitor conductor 32, a dielectric layer 34, and a power capacitor conductor 36.

A respective one of the ground reference voltage capacitor conductors 32 is first formed on each of the regions 30. Each respective ground reference voltage capacitor conductor 32 has an area that covers a majority of an area of the respective region 30. A smaller area may be covered by a respective capacitor conductor if space is limited by other components such as pins, or if more than one capacitor is required for each integrated circuit. The ground reference voltage capacitor conductor 32 is formed over some of the distribution board conductors 26. A portion 38 of the ground reference voltage capacitor conductor 32 is formed on a portion only of the ground reference voltage distribution board contact terminal 24G of the respective region 30. A ground reference voltage can thus be provided through the ground reference voltage distribution board contact terminal 24G to the ground reference voltage capacitor conductor 32. The ground reference voltage capacitor conductor 32 is not in contact with the power distribution board contact terminal 24P or any of the signal distribution board contact terminals 24S.

A respective dielectric layer 34 is subsequently formed on each one ground reference voltage capacitor conductor 32. Thin film technologies are used to form the dielectric layers 34. The dielectric layers are made of a high k-value (typically at least 300) dielectric material. Each dielectric layer 34 covers substantially all of the respective ground reference voltage capacitor conductor 32 but is not formed on any of the distribution board contact terminals 24.

The power capacitor conductors 36 are then formed on all the dielectric layers 34. Each power capacitor conductor 36 has an area that is approximately the same as the area of the respective ground reference voltage conductor 32. A portion 40 of the power capacitor conductor 36 is located off the respective dielectric layer 34 and is in contact with the respective power distribution board contact terminal 24P of the respective region 30. All other edges of the power capacitor conductor 36 are within a periphery of the dielectric layer 34 so that the power capacitor conductor 36 is not in contact with the ground reference voltage capacitor conductor 32 or any of the distribution board contact terminals 24G and 24S. In another embodiment, more than one capacitor may be formed at each one of the regions 30, either adjacent to one another in an x-y plane or one above the other in a z-direction.

One respective capacitor 18 is thus formed at each one of the regions 30. Each capacitor 18 has substantially flat capacitor conductors 32 and 36 in x-y planes that take up a small amount of space in a z-direction. Notwithstanding the fact that substantially flat capacitor conductors 32 and 36 (as opposed to wound conductors) are formed, the capacitor conductors 32 and 36 form parallel plates over a relatively large area because they can be formed over a majority of an area of each region 30.

Referring again to FIG. 1, the contactor board 20 includes a contactor substrate 42 and a plurality of contactor pins 44. The contactor substrate 42 is made out of a non-conductive ceramic material. Other non-conductive materials such as plastics materials may alternatively be used for the contactor substrate 42. The contactor pins 44 are held by the contactor substrate 42, and each contactor pin 44 has first and second opposing ends 46 and 48 extending from the opposing sides of the contactor substrate 42. Each contactor pin 44 has a respective spring (not shown), and the ends 46 and 48 can be moved toward one another against a spring force of the spring. Other springs may be used instead of springable pins, such as pressured conductive rubber (PCR), three-part system (TPS), or bendable springs. Openings are formed in the contactor substrate 42 in which the contactor pins 44 are located so that the pins extend in a z-direction and their layout matches a layout of the distribution board contact terminals 24.

An alignment mechanism is used to align the contactor board 20 with the distribution board 16 so that the second end 48 of each contactor pin 44 is above a respective one of the distribution board contact terminals 24. The second ends 48 are then brought into contact with the distribution board contact terminals 24. Further movement of the contactor substrate 42 toward the distribution board 16 causes depression of the second ends 48 by the distribution board contact terminals 24 relatively toward the contactor substrate 42. The spring forces of the springs create forces between the second ends 48 and the distribution board contact terminals 24, and thus ensure proper contact. The contactor substrate 42 is then mounted to the distribution substrate 22.

The assembled system 10 can then be used to test the integrated circuits 12 of the unsingulated wafer 14. The unsingulated wafer 14 includes a semiconductor wafer substrate 50 with the integrated circuits 12 formed thereon. A plurality of die contacts 52 are formed on the integrated circuits 12, to which power, a ground reference voltage and signals can be provided to or from the integrated circuits 12. After testing, the wafer substrate 50 will be singulated along scribe streets 54 into individual dies. The unsingulated wafer 14 is placed face-down on the first ends 46 of the contactor pins 44. A layout of the die contacts 52 is a mirror image of the layout of the distribution board contact terminals 24, i.e., there is no x-y transformation from the distribution board contact terminals 24 to the die contacts 52, although an x-y transformation may be possible in a different embodiment. Each one of the die contacts 52 is in contact with a respective first end 46 of a respective contact pin 44. A vacuum is then created in a space between the contactor substrate 42 and the unsingulated wafer 14. A reduced pressure due to the vacuum creates forces that maintain the die contacts 52 in proper contact with the first ends 46 of the contactor pins 44. In another embodiment, the pressure may be increased on the outside utilizing auxiliary apparatus, thereby also creating a pressure differential between the outside and the inside.

Power, a ground reference voltage, and signals can then be provided through the distribution board conductors 26, the distribution board contact terminals 24, the contactor pins 44, and the die contacts 52 to or from the integrated circuits 12. The capacitors 18 store charge close to the integrated circuits 12 to avoid power spikes and provide a circuit that reduces perturbations in the voltage difference between power and ground pins when the integrated circuits 12 are tested. When testing of the integrated circuits 12 is completed, the pressure differential due to the vacuum is released and the unsingulated wafer 14 is removed from the system 10. Another unsingulated wafer may then be tested in a similar manner.

Figure 3:
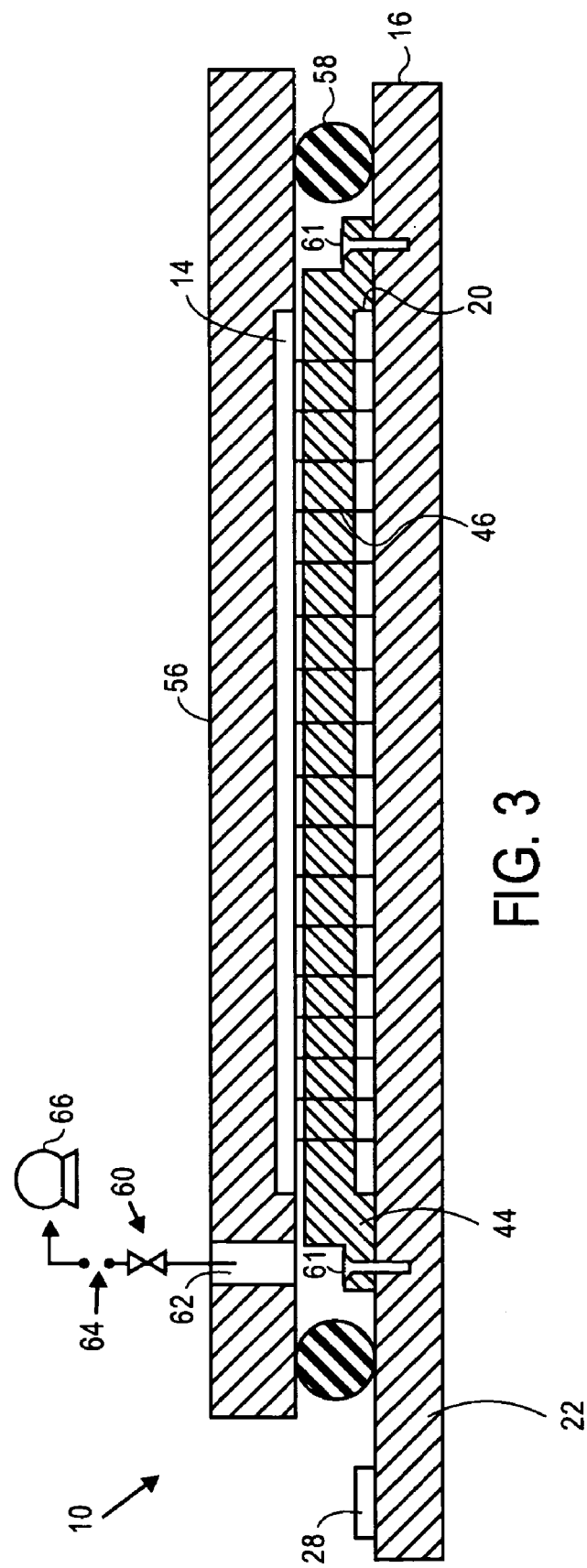
FIG. 3 is a cross-sectional side view illustrating more components of the system.

FIG. 3 illustrates further components of the system 10, including a wafer carrier cover 56, a resilient o-ring seal 58, and a valve 60. The contactor substrate 42 is mounted to the distribution substrate 22 by fastener screws 61, or may be bonded in another embodiment. The seal 58 is positioned on the distribution board 16 around the contactor board 20. The wafer 14 is held by the wafer carrier cover 56. The wafer carrier cover 56 is then located on the seal 58. A suction passage 62 is formed through the wafer carrier cover 56. Except for the suction passage 62, an enclosed volume is defined within the seal 58, the distribution board 16 and below the wafer carrier cover 56. The suction passage 62 is connected inline through the valve 60 and a releasable connector 64 to a pump 66 or pressure reservoir. In use, the pump 66 is operated when the connector 64 is connected and the valve 60 is open so that the pump 66 creates a vacuum below the wafer carrier cover 56. With the vacuum created, the valve 60 is closed, and the connector 64 is released with the vacuum being maintained with the valve 60.

The system 10 including the valve 60 is then placed in a thermal management system such as an oven, and the distribution board interface 28 is connected to a connector in the thermal management system. The thermal management system may also have the capability to dynamically maintain the vacuum. The thermal management system controls the temperature of the wafer 14 while power, a ground reference voltage and signals are provided through the connector to the distribution board interface 28.

Figure 4:
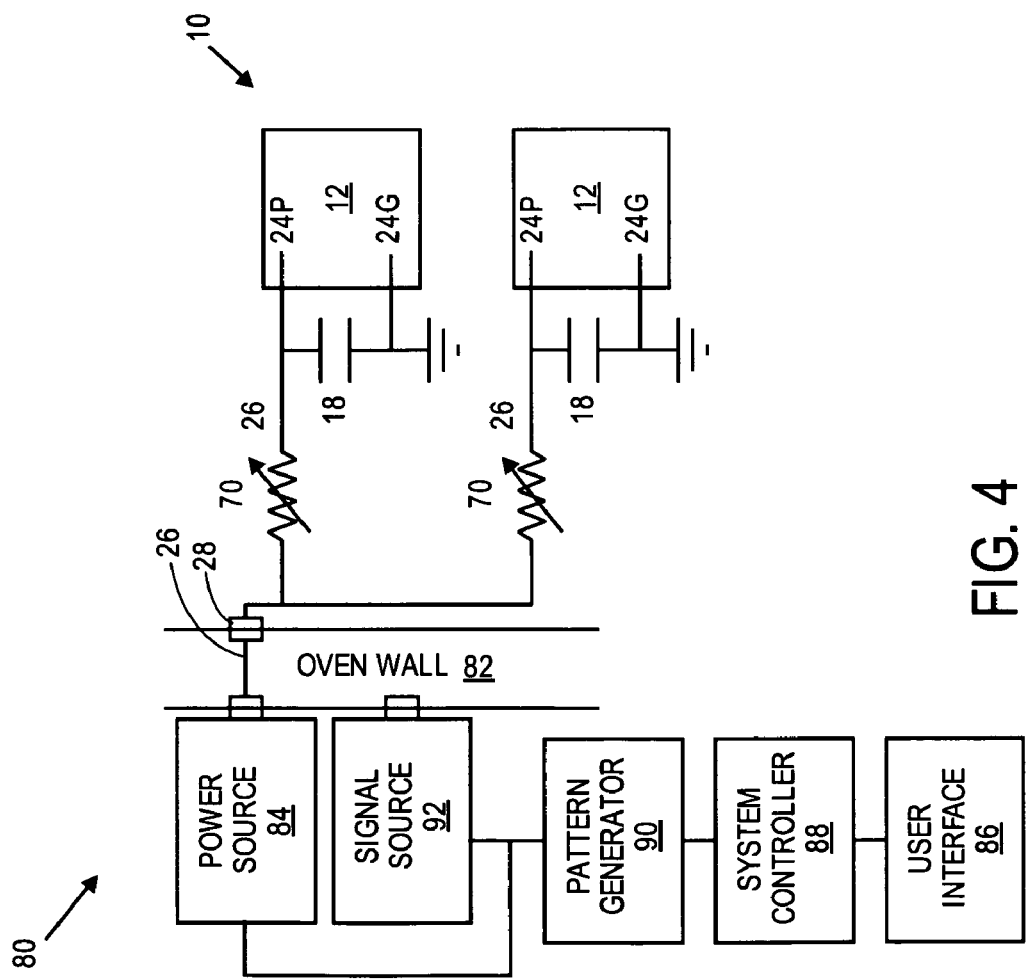
FIG. 4 is a top plan view representing a portion of a circuit that is formed in the distribution board and specifically showing fuses that are used to limit current to the respective integrated circuits.

As illustrated in FIG. 4, the system 10 further includes a plurality of fuses 70. Each fuse 70 is located in a respective one of the distribution board conductors 26 providing power to a respective one of the power distribution board contact terminals 24P. More than one power distribution board contact terminal may be associated with a respective fuse if space is limited. The fuses 70 are located in parallel to one another, so that when one of the fuses 70 reduces current to a respective power distribution board contact terminal 24P to which it is directly connected, current can still flow to all the other power distribution board contact terminals 24P.

Figure 5:
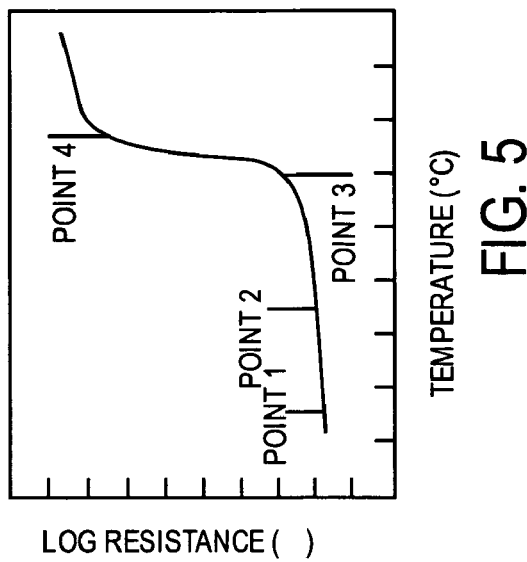
FIG. 5 is a graph illustrating the resistance of one of the fuses on a logarithmic scale against temperature.

Each fuse 70 is made of a polymer with a small resistance at a low temperature so that current can flow therethrough, but with a large resistance when the temperature thereof increases. Other non-polymer resettable fuses may alternatively be used, e.g., bimetallic switches or transistor-based switches. FIG. 5 illustrates, on the logarithmic scale, that the resistance of the material increases almost linearly from Point 1 to Point 2, but then increases exponentially from Point 2 past Point 3 to Point 4 with an increase in temperature. If one of the integrated circuits 12 creates a short during testing, the resulting increased current will cause the temperature of the fuse 70 to increase. The increased temperature increases the resistance of the fuse 70 so that the fuse 70 substantially eliminates dangerous or excessive current to the shorted integrated circuit 12. The temperature of the fuse 70 reduces again when testing is terminated and the wafer is removed, and there is then a corresponding reduction in resistance of the fuse 70 so that a "normal" amount of current can again flow through the fuse 70. A die in the same location on a subsequent wafer can then receive power current through the fuse 70.

FIGS. 1 and 2 for capacitors 18 could be slightly modified for the fuses 70. The resettable fuses 70 work by providing a conductive matrix between two electrodes. In the case of a capacitor 18, an insulating material 34 is provided with a high dielectric constant and high resistance. In the case of the fuse 70, two electrodes with a low resistance material (typically filled polymer material) are provided. This material has some resistance so that when current runs therethrough, it acts like any good resistor and heats up. If the current is enough to heat the material up high enough, the material becomes more insulating and eventually (and ideally, abruptly) opens up. As long as a voltage is applied, enough current flows to keep the temperature high enough to be open. When the voltage is turned off, current stops flowing and the fuse 70 resets.

The fuses 70 allow the contactor system 10 to be inserted and used in a standard burn-in system 80, i.e., without the need to provide separate power shut-off devices. The burn-in system 80 may have an oven wall and the distribution board conductors 26 may be located on a feedthrough board in the oven wall 82. A power source 84 is located on one side of the oven wall 82 and the contactor system 10 is located on an opposing side of the oven wall 82.

As further illustrated in FIG. 4, the burn-in system 80 further includes a user interface 86, a system controller 88, a pattern generator 90, and a signal source 92, connected to one another in series. An operator can use the user interface 86 to load a desired pattern. The system controller 88 then controls the pattern generator 90 so that the pattern generator 90 provides the desired pattern to the signal source 92. The signal source 92 then provides signals to the integrated circuits 12 corresponding to the pattern provided by the pattern generator 90. The pattern generator 90 also controls the power source 84. Alternatively, the power source 84 can be controlled by the system controller 88.

Figure 6:
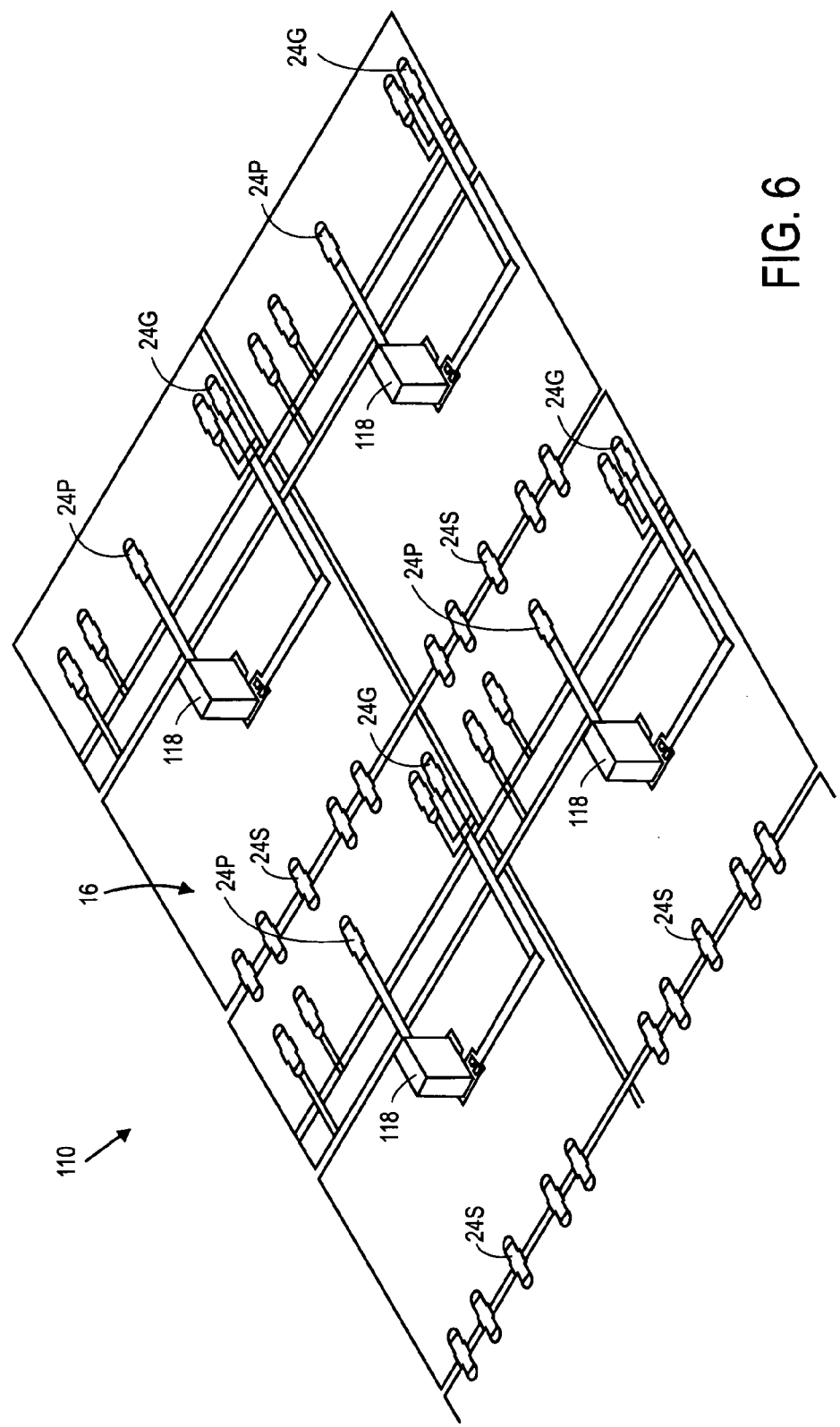
FIG. 6 is a perspective view of components of a system, according to another embodiment of the invention, wherein discrete capacitors, e.g., wound capacitors, are mounted to a distribution board.

FIG. 6 illustrates components of a system 110 according to another embodiment of the invention. The system 110 includes a distribution board 16 which is the same as the distribution board 16 in FIG. 2. An array of discrete wound capacitors 118 are mounted to the distribution boards 16 instead of the planar capacitors 18 of FIG. 2. A discrete wound capacitor is an off-the-shelf component that can simply be mounted to the distribution board 16.

Figure 7:
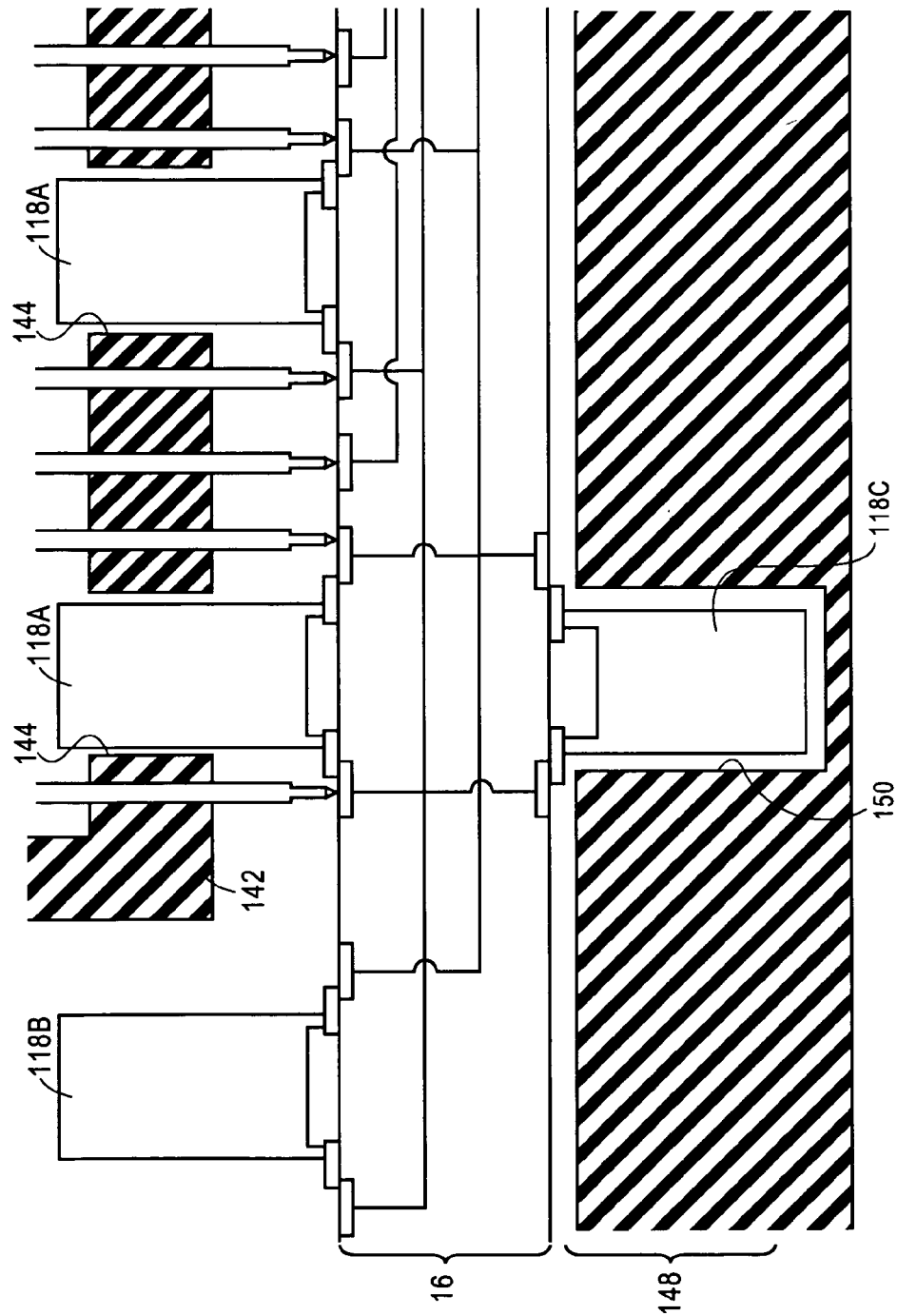
FIG. 7 is a cross-sectional side view of the system of FIG. 6, specifically showing capacitor openings that are formed in a contactor substrate to accommodate the discrete capacitors standing above the distribution board.

FIG. 7 illustrates an alternative contactor substrate 142 having an array of capacitor openings 144 into a lower portion thereof. The openings 144 may alternatively extend all the way through the contactor substrate 142, depending on how much space should be provided for capacitors. Each one of the capacitor openings 144 registers with a respective one of the discrete wound capacitors 118A so that each capacitor 118A is inserted into a respective one of the capacitor openings 144 when the contactor substrate 142 and the distribution board 16 are brought together. The capacitor openings 144 thus accommodate the discrete wound capacitors 118A standing above an upper surface of the distribution board 16. Further capacitors 118B are located outside an area of the contactor substrate 142 and extend past a plane of a lower surface thereof.

As further illustrated in FIG. 7, a backing substrate 148 is provided, to which the distribution board 16 is mounted. The backing substrate 148 has a plurality of capacitor openings 150 into an upper portion thereof. Discrete wound capacitors 118C are mounted to a lower surface of the distribution board 16 and are accommodated in a respective one of the capacitor openings 150.

Referring again to FIG. 4, the fuses 70 are typically discrete components that have to be mounted outside an area of the contactor substrate (reference numeral 42 in FIG. 1 or reference numeral 142 in FIG. 7) as with the discrete wound capacitors 118 in FIG. 6. Discrete electric components such as the fuses 70 in FIG. 4 may alternatively be mounted within an area of a contactor substrate and openings may be defined in the contactor substrate to accommodate the fuses.

It is within the scope of this invention that the term "fuse" as used herein should be broadly interpreted and encompass components that are not referred to in the art as "fuses," i.e., electric disconnects such as sensor-based switches, etc. It should also be understood that "integrated circuit" includes a circuit that is not necessarily a circuit with MOS transistors, such as a circuit with laser diodes.

Furthermore, although the testing of an unsingulated wafer is described, it should be understood that other devices may be tested. One such device may, for example, be a strip including a substrate with a plurality of dies mounted thereto. Another device may be a film frame including an adhesive tape and a plurality of dies held on the adhesive tape.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

The invention claimed is:

1. A system for testing integrated circuits on an unsingulated substrate, comprising:
   i) a distribution board which includes:
   (1) a distribution substrate having a plurality of regions corresponding to the integrated circuits;
   (2) a plurality of distribution board terminals at each region, the distribution board terminals at each region including at least one signal, power and reference voltage distribution board terminal;
   (3) a plurality of distribution board conductors carried by the distribution substrate, including signal, power and reference voltage distribution board conductors connected to the signal, power and reference voltage distribution board terminals, respectively; and (4) at least one distribution board interface on the distribution substrate, to which the distribution board conductors are connected; and ii) at least one capacitor including spaced power and reference voltage capacitor conductors electrically connected to the power and reference voltage distribution board terminals, respectively, of at least one of the regions.

2. The system of claim 1, wherein the unsingulated substrate is a wafer.

3. The system of claim 1, wherein the capacitor is carried by the distribution board.

4. The system of claim 1, wherein the power and reference voltage capacitor conductors are substantially flat planar conductors.

5. The system of claim 4, wherein each substantially flat planar conductor has a respective area comprising the majority of a respective area of the respective region.

6. The system of claim 4, wherein the distribution board terminals are contacts, and wherein each substantially flat planar capacitor conductor has a portion formed on a respective contact, the capacitor further including a dielectric layer between the substantially flat capacitor conductors.

7. The system of claim 4, wherein each substantially flat planar conductor is formed over at least some of the distribution board conductors.

8. The system of claim 1, further comprising a plurality of capacitors, each capacitor including spaced power and reference voltage capacitor conductors electrically connected to respective power and reference voltage distribution board terminals of a plurality of the respective regions.

9. The system of claim 1, further comprising:
iii) a contactor, which includes:
   (1) a contactor substrate having a first side facing the distribution substrate and a second opposing side;
   (2) a first plurality of contactor terminals on the first side, each contacting a respective one of the distribution board terminals; and
   (3) a second plurality of contactor terminals on the second side of the contactor substrate, each connected to a respective one of the first plurality of contactor terminals and each for contacting a respective integrated circuit contact of a respective one of the integrated circuits.

10. The system of claim 9, wherein one of the distribution substrate and contactor substrate is a first substrate and the other one of the distribution substrate and the contactor substrate is a second substrate, the capacitor being mounted to the first substrate, at least one capacitor opening being formed in the second substrate and the capacitor being inserted in the capacitor opening.

11. The system of claim 10, wherein the distribution substrate is the first substrate.

12. The system of claim 10, comprising a plurality of capacitors, each being mounted to the first substrate, and a plurality of capacitor openings in the second substrate, each capacitor being inserted in a respective one of the capacitor openings.

13. The system of claim 9, wherein there is no x-y transformation from the first plurality of contactor terminals to the second plurality of contactor terminals.

14. The system of claim 13, wherein the contactor further includes:
(4) a plurality of pins held by the contactor substrate, each pin having opposing ends that form the respective first and second contactor terminals.

15. The system of claim 1, further comprising:
iii) at least one fuse that automatically limits current flowing to at least one of the integrated circuits.

16. The system of claim 15, wherein the fuse is made of a polymer material that limits current flowing therethrough when a temperature thereof increases.

17. The system of claim 16, wherein the fuse is a substantially flat planar device.

18. A system for testing integrated circuits, comprising:
i) a distribution board which includes:
   (1) a distribution substrate having a plurality of regions corresponding to the integrated circuits;
   (2) a plurality of distribution board terminals at each region, the distribution board terminals at each region including at least one power and reference voltage distribution board terminals;
   (3) a plurality of distribution board conductors carried by the distribution substrate, including power and reference voltage distribution board conductors connected to the power and reference voltage distribution board terminals, respectively; and
   (4) at least one distribution board interface, on the distribution substrate, to which the distribution board conductors are connected;
ii) a discrete electric component mounted to and standing above the distribution substrate; and
iii) a contactor, which includes:
   (1) a contactor substrate having a first side facing the distribution substrate and a second opposing side, the discrete electric component extending past a plane of the first side of the contactor substrate;
   (2) a first plurality of contactor terminals on the first side, each contacting a respective one of the distribution board terminals; and
   (3) a second plurality of contactor terminals on the second side of the contactor substrate, each connected to a respective one of the first plurality of contactor terminals and each contacting a respective integrated circuit contact of a respective one of the integrated circuits.

19. The system of claim 18, wherein an opening is formed in the first side of the contactor substrate and the discrete electric component is inserted into the opening.

20. The system of claim 18, wherein the discrete electric component is a fuse.

21. The system of claim 18, wherein the distribution substrate includes signal conductors.

22. A system for testing integrated circuits, comprising:
i) a backing substrate having an opening formed therein;
ii) a distribution board which includes:
   (1) a distribution substrate having a plurality of regions corresponding to the integrated circuits;
   (2) a plurality of distribution board terminals at each region, the distribution board terminals at each region including at least one power and reference voltage distribution board terminals;
   (3) a plurality of distribution board conductors carried by the distribution substrate, including power and reference voltage distribution board conductors connected to the power and reference voltage distribution board terminals, respectively; and (4) at least one distribution board interface, on the distribution substrate, to which the distribution board conductors are connected;

iii) a discrete electric component mounted to the distribution substrate, the distribution board being mounted to the backing substrate with the discrete electric component inserted in the opening in the backing substrate; and iv) a contactor, which includes:
  (1) a contactor substrate having a first side facing the distribution substrate and a second opposing side;
  (2) a first plurality of contactor terminals on the first side, each contacting a respective one of the distribution board terminals; and
  (3) a second plurality of contactor terminals on the second side of the contactor substrate, each connected to a respective one of the first plurality of contactor terminals and each contacting a respective integrated circuit contact of a respective one of the integrated circuits.

23. The system of claim 22, wherein the distribution substrate includes signal conductors.

24. A system for testing integrated circuits, comprising:
i) a distribution board which includes:
  (1) a distribution substrate having a plurality of regions corresponding to the integrated circuits;
  (2) a plurality of distribution board terminals at each region, the distribution board terminals at each region including at least one power and reference voltage distribution board terminals;
  (3) a plurality of distribution board conductors carried by the distribution substrate, including power and reference voltage distribution board conductors connected to each power and reference voltage distribution board terminals, respectively; and
  (4) at least one distribution board interface, on the distribution substrate, to which the distribution board conductors are connected; and
ii) a contactor, which includes:
  (1) a contactor substrate having a first side facing the distribution substrate and a second opposing side;
  (2) a first plurality of contactor terminals on the first side of the contactor substrate, each contacting a respective one of the distribution board terminals; and
  (3) a second plurality of contactor terminals on the second side of the contactor substrate, each connected to a respective one of the first plurality of contactor terminals and each contacting a respective integrated circuit contact of a respective one of the integrated circuits; and
iii) at least one fuse that automatically limits current flowing to at least one of the integrated circuits.

25. The system of claim 24, wherein the distribution substrate includes signal conductors.

26. The system of claim 24, wherein the fuse is made of a polymer material that limits current flowing therethrough when a temperature thereof increases.

* * * * *